United States Patent
Sasaki et al.

(10) Patent No.: US 9,461,124 B2
(45) Date of Patent: Oct. 4, 2016

(54) $GA_2O_3$ SEMICONDUCTOR ELEMENT

(75) Inventors: Kohei Sasaki, Tokyo (JP); Masataka Higashiwaki, Tokyo (JP)

(73) Assignees: TAMURA CORPORATION, Tokyo (JP); NATIONAL INSTITUTE OF INFORMATION AND COMMUNICATIONS TECHNOLOGY, Tokyo (JP)

( * ) Notice: Subject to any disclaimer, the term of this patent is extended or adjusted under 35 U.S.C. 154(b) by 0 days.

(21) Appl. No.: 14/343,686

(22) PCT Filed: Sep. 7, 2012

(86) PCT No.: PCT/JP2012/072902
§ 371 (c)(1),
(2), (4) Date: Mar. 7, 2014

(87) PCT Pub. No.: WO2013/035845
PCT Pub. Date: Mar. 14, 2013

(65) Prior Publication Data
US 2014/0217405 A1    Aug. 7, 2014

(30) Foreign Application Priority Data
Sep. 8, 2011    (JP) .................................. 2011-196440

(51) Int. Cl.
*H01L 29/24*      (2006.01)
*H01L 29/78*      (2006.01)
(Continued)

(52) U.S. Cl.
CPC ......... *H01L 29/24* (2013.01); *H01L 21/02414* (2013.01); *H01L 21/02433* (2013.01);
(Continued)

(58) Field of Classification Search
CPC ................ H01L 2224/05105; H01L 29/4236; H01L 29/66734; H01L 29/7397
See application file for complete search history.

(56) References Cited

U.S. PATENT DOCUMENTS 6,168,996 B1 *   1/2001   Numazawa et al. .......... 438/270
6,686,616 B1      2/2004   Allen et al.
(Continued)

FOREIGN PATENT DOCUMENTS

CN         1754013 A      3/2006
CN     101091258 A    12/2007
(Continued)

OTHER PUBLICATIONS

Suzuki, et al. "Fabrication and Characterization of transparent conductive Sn-doped B—Ga2O3 single crystal", phys. stat. sol. (c) 4, No. 7, pp. 2310-2313, (2007).*
(Continued)

*Primary Examiner* — Tom Thomas
*Assistant Examiner* — Vincent Wall
(74) *Attorney, Agent, or Firm* — McGinn IP Law Group PLLC

(57) ABSTRACT

A $Ga_2O_3$ semiconductor element, includes: an n-type β-$Ga_2O_3$ substrate; a β-$Ga_2O_3$ single crystal film, which is formed on the n-type β-$Ga_2O_3$ substrate; source electrodes, which are formed on the β-$Ga_2O_3$ single crystal film; a drain electrode, which is formed on the n-type β-$Ga_2O_3$ substrate surface on the reverse side of the β-$Ga_2O_3$ single crystal film; n-type contact regions, which are formed in the β-$Ga_2O_3$ single crystal film, and have the source electrodes connected thereto, respectively; and a gate electrode, which is formed on the β-$Ga_2O_3$ single crystal film with the gate insulating film therebetween.

14 Claims, 5 Drawing Sheets

(51) Int. Cl.
  *H01L 21/02* (2006.01)
  *H01L 29/66* (2006.01)
  *H01L 29/04* (2006.01)
  *H01L 29/36* (2006.01)

(52) U.S. Cl.
  CPC ... *H01L21/02483* (2013.01); *H01L 21/02565* (2013.01); *H01L 21/02576* (2013.01); *H01L 21/02581* (2013.01); *H01L 21/02631* (2013.01); *H01L 29/66712* (2013.01); *H01L 29/66734* (2013.01); *H01L 29/78* (2013.01); *H01L 29/7802* (2013.01); *H01L 29/7813* (2013.01); *H01L 29/045* (2013.01); *H01L 29/36* (2013.01); *H01L 29/365* (2013.01)

(56) References Cited

U.S. PATENT DOCUMENTS

| | | | |
|---|---|---|---|
| 7,151,280 B2 * | 12/2006 | Hayashi et al. | 257/77 |
| 2003/0020136 A1 * | 1/2003 | Kitabatake | H01L 29/7828 257/502 |
| 2003/0137018 A1 | 7/2003 | Passlack et al. | |
| 2004/0104429 A1 | 6/2004 | Takahashi et al. | |
| 2004/0132249 A1 | 7/2004 | Mitsuda et al. | |
| 2006/0076617 A1 | 4/2006 | Shenoy et al. | |
| 2006/0150891 A1 | 7/2006 | Ichinose et al. | |
| 2007/0108512 A1 * | 5/2007 | Sedlmaier | H01L 29/0634 257/328 |
| 2007/0264782 A1 | 11/2007 | Shenoy et al. | |
| 2008/0197405 A1 * | 8/2008 | Pfirsch | H01L 29/66727 257/329 |
| 2008/0265264 A1 | 10/2008 | Ichinose et al. | |
| 2010/0229789 A1 | 9/2010 | Ichinose et al. | |
| 2011/0115017 A1 | 5/2011 | Alter et al. | |
| 2012/0304918 A1 | 12/2012 | Ichinose et al. | |
| 2013/0316508 A1 | 11/2013 | Alter et al. | |

FOREIGN PATENT DOCUMENTS

| | | | |
|---|---|---|---|
| EP | 0653786 A2 | 5/1995 | |
| EP | 1 598 450 A2 | 11/2005 | |
| EP | 1598450 A2 * | 11/2005 | C30B 23/02 |
| JP | 2006-269924 A | 10/2006 | |
| JP | 2008-118011 A | 5/2008 | |
| JP | 2008-303119 A | 12/2008 | |
| JP | 2008303119 A * | 12/2008 | |
| JP | 2009-049198 A | 3/2009 | |
| JP | 2009-064970 A | 3/2009 | |
| JP | 2009-111004 A | 5/2009 | |
| JP | 2009-126764 A | 6/2009 | |
| JP | 2009-130013 A | 6/2009 | |
| JP | 2010-027962 A | 2/2010 | |
| JP | 2010-219130 A | 9/2010 | |
| JP | 2011-109100 A | 6/2011 | |

OTHER PUBLICATIONS

Villora, et al., "Rf-plasma-assisted molecular-beam epitaxy of β—Ga2O3", App. Phys. Lett. 88, 031105, (2006), pp. 1-3.*
Machine translation of JP2008-303119A.*
Matsuzaki, et al., "Growth, structure and carrier transport properties of Ga2O3 epitaxial film examined for transparent field-effect transisor", Thin Solid Fims, 496, 2006, 37-21.*
Geller, S., "Crystal Structure of beta-Ga2O3"), Journal of Chemical Physics, 33, 676, 1960, p. 676-684.*
Higashiwaki, et al., "Gallium oxide (Ga2O3) metal-semiconductor field-effect transistors on single crystal beta-Ga2O3 (010) substrates", Applied Physics Letters 100, 013504, 2012, pp. 1-4.*
International Search Report dated Oct. 9, 2012 in PCT/JP2012/072897 (English version).
Kosuke Matsuzaki et al, "Growth, structure and carrier transport properties of $Ga_2O_3$ epitaxial film examined for transparent field-effect transistor", Thin Solid films 496 (2006) pp. 37-41.
Kosuke Matsuzaki et al, "Field-Induced current modulation in eptaxial film of deep-ultraviolet transparent oxide semiconductor Ga2O3", Appl. Phys. Lett. 88, 092106(Mar. 1 2006); doi: 10.1063/1.2179373.
Min-Ying Tsaia et aI, "β-$Ga_2O_3$ growth by plasma-assisted molecular beam epitaxy", J. Vac. Sci.Technol. A, Mar. 2010, vol. 28, No. 2, pp. 354-359.
K. Iwaya et al, "Atomically resolved silicon donor states of β-$Ga_2O_3$,", Appl. Phys. Lett., Apr. 4, 2011, vol. 98, No. 14, pp. 142116.
United States Office Action dated Dec. 17, 2014 in U.S. Appl. No. 14/343,367.
Japanese Office Action dated Feb. 24, 2015 with partial English Translation.
United States Office Action dated May 29, 2015 in co-pending U.S. Appl. No. 14/343,367.
Extended European Search Report dated Jun. 23, 2015.
Zitouni, M, et al. "A New Lateral DMOSFET Structure with Extremely Reduced On- Resistance and Enhanced Breakdown Voltage". 8th European Conference on Power Electronics and Applications. Laussanne, CH, Sep. 7-9, 1999; [EPE. European Conference on Power Electronics and Applications], EPE Association, Brussels, BE, vol. CONF. 8, Sep. 7, 1999, pp. 1-09, XP000890316.
European Search Report dated Apr. 10, 2015.
Casady, et al. "Silicon Carbide Power MOSFET Technology" , Proceedings of the IEEE 24th Int'l Symposium on Compound Semiconductors, vol. 156, 1997, pp. 359-362.
Otake, et al. "Vertical GaN-Based Trench Gate Metal Oxide Semiconductor Field-Effect Transistors on GaN Bulk Substrates" , Applyied Physics Express, vol. 1, No. 1, 2008, pp. 011105-1-011105-3.
Chinese Office Action dated Jan. 4, 2016 with English Translation.
United States Notice of Allowance dated Mar. 10, 2016 in co-pending U.S. Appl. No. 14/343,367.
European Communication pursuant to Article 94(3) EPC dated Jul. 5, 2016.

* cited by examiner

GA₂O₃ SEMICONDUCTOR ELEMENT

TECHNICAL FIELD

The invention relates to a $Ga_2O_3$-based semiconductor element.

BACKGROUND ART

A $Ga_2O_3$-based semiconductor element using a $Ga_2O_3$ crystal film formed on a sapphire substrate is known (see, e.g., NPLs 1 and 2).

CITATION LIST

Non Patent Literature

[NPL 1]
K. Matsuzaki et al. Thin Solid Films 496, 2006, pp. 37-41.
[NPL 2]
K. Matsuzaki et al. Appl. Phys. Lett. 88, 092106, 2006.

SUMMARY OF INVENTION

Technical Problem

However, since the crystal structure of $Ga_2O_3$ crystal is completely different from that of sapphire crystal, it is very difficult to heteroepitaxially grow a $Ga_2O_3$ crystal on a sapphire substrate. Thus, it is difficult to form a high-quality $Ga_2O_3$-based semiconductor element by using a $Ga_2O_3$ crystal film grown on a sapphire substrate.

It is an object of the invention to provide a high-quality $Ga_2O_3$-based semiconductor element.

Solution to Problem

According to one embodiment of the invention, a $Ga_2O_3$-based semiconductor element as defined in [1] to [4] below is provided so as to achieve the object.

[1] A $Ga_2O_3$-based semiconductor element, including a $\beta$-$Ga_2O_3$ substrate including a first conductivity type, a $\beta$-$Ga_2O_3$ single crystal film formed on the $\beta$-$Ga_2O_3$ substrate directly or via an other layer, a source electrode formed on the $\beta$-$Ga_2O_3$ single crystal film, a drain electrode formed on a surface of the $\beta$-$Ga_2O_3$ substrate opposite to the $\beta$-$Ga_2O_3$ single crystal film, a contact region formed in the $\beta$-$Ga_2O_3$ single crystal film, connected to the source electrode and including the first conductivity type, and a gate electrode that is formed on the $\beta$-$Ga_2O_3$ single crystal film or formed via a gate insulating film in a trench formed in the $\beta$-$Ga_2O_3$ single crystal film.

[2] The $Ga_2O_3$-based semiconductor element according to [1], wherein the source electrode includes first and second source electrodes, wherein the gate electrode is formed via the gate insulating film on a region between the first source electrode and the second source electrode on the $\beta$-$Ga_2O_3$ single crystal film, wherein the $\beta$-$Ga_2O_3$ single crystal film includes the first conductivity type, wherein the contact region includes first and second contact regions connected to the first and second source electrodes, respectively, and wherein the semiconductor element further includes first and second body regions including a second conductivity type different from the first conductivity type or a high resistance and formed so as to surround the first and second contact regions, respectively.

[3] The $Ga_2O_3$-based semiconductor element according to [1], wherein the $\beta$-$Ga_2O_3$ single crystal film is formed on the $\beta$-$Ga_2O_3$ substrate via an other $\beta$-$Ga_2O_3$ single crystal film including the first conductivity type, wherein the $\beta$-$Ga_2O_3$ single crystal film includes a second conductivity type different from the first conductivity type or includes no dopants, the gate electrode is formed in the trench via the gate insulating film, and the contact region includes first and second contact regions on both sides of the gate electrode.

[4] The $Ga_2O_3$-based semiconductor element according to any one of [1] to [3], wherein the first and second conductivity types are an n-type and a p-type, respectively.

Advantageous Effects of Invention

When the main surface of the n-type $\beta$-$Ga_2O_3$ substrate is a plane rotated by not less than 50° and not more than 90° with respect the (100) plane, it is possible to effectively suppress re-evaporation of raw materials of the $\beta$-$Ga_2O_3$-based crystal from the n-type $\beta$-$Ga_2O_3$ substrate at the time of epitaxially growing the $\beta$-$Ga_2O_3$-based crystal on the n-type $\beta$-$Ga_2O_3$ substrate. In detail, where a percentage of the re-evaporated-raw material during growth of the $\beta$-$Ga_2O_3$-based crystal at a growth temperature of 500° C. is defined as 0%, the percentage of the re-evaporated raw material can be suppressed to not more than 40% when the main surface of the n-type $\beta$-$Ga_2O_3$ substrate is a plane rotated by not less than 50° and not more than 90° with respect the (100) plane. It is thus possible to use not less than 60% of the supplied raw material to form the $\beta$-$Ga_2O_3$-based crystal, which is preferable from the viewpoint of growth rate and manufacturing cost of the $\beta$-$Ga_2O_3$-based crystal.

According to an embodiment of the invention, a high-quality $Ga_2O_3$-based semiconductor element can be provided.

DESCRIPTION OF EMBODIMENTS

According to the present embodiment, it is possible to form a high-quality $\beta$-$Ga_2O_3$-based single crystal film by homoepitaxial growth and use of such a high-quality $\beta$-$Ga_2O_3$-based single crystal film allows a high-quality $Ga_2O_3$-based semiconductor element to be formed. Examples of embodiments thereof will be described in detail below.

First Embodiment

A $Ga_2O_3$-based MISFET (Metal Insulator Semiconductor Field Effect Transistor) having a planar gate structure will be described as the $Ga_2O_3$-based semiconductor element in the first embodiment.

(Structure of $Ga_2O_3$-Based Semiconductor Element)

Figure 1:
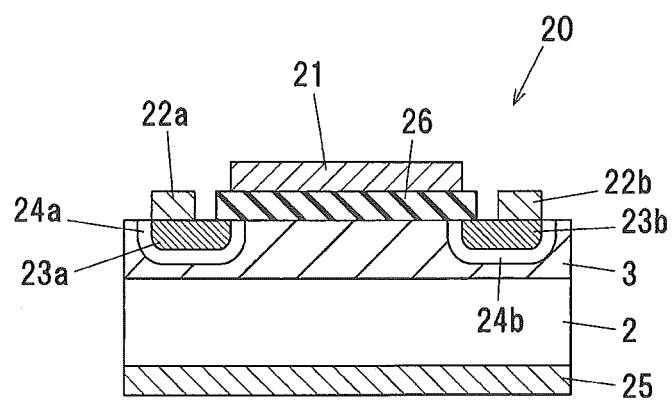
FIG. 1 is a cross sectional view showing a $Ga_2O_3$-based MISFET in a first embodiment.

FIG. 1 is a cross sectional view showing a $Ga_2O_3$-based MISFET 20 in the first embodiment. The $Ga_2O_3$-based MISFET 20 includes an n-type $\beta$-$Ga_2O_3$ single crystal film 3 formed on an n-type $\beta$-$Ga_2O_3$ substrate 2, source electrodes 22a and 22b which are formed on the n-type $\beta$-$Ga_2O_3$ single crystal film 3, a gate electrode 21 formed on the n-type $\beta$-$Ga_2O_3$ single crystal film 3 via a gate insulating film 26 in a region between the source electrodes 22a and 22b, n-type contact regions 23a and 23b which are formed in the n-type $\beta$-$Ga_2O_3$ single crystal film 3 respectively under the source electrodes 22a and 22b, body regions 24a and 24b respectively surrounding the n-type contact regions 23a and 23b, and a drain electrode 25 formed on the n-type $\beta$-$Ga_2O_3$ substrate 2 on a surface opposite to the n-type $\beta$-$Ga_2O_3$ single crystal film 3.

The $Ga_2O_3$-based MISFET 20 is a vertical-type semiconductor element in which source and drain electrodes are arranged respectively on upper and lower sides of the element and a current flows in a vertical direction. When voltage of more than the threshold is applied to the gate electrode 21, channels are formed in regions of the p-type body regions 24a and 24b under the gate electrode 21 and a current thus flows from the source electrodes 22a and 22b to the drain electrode 25.

The n-type $\beta$-$Ga_2O_3$ substrate 2 includes an n-type dopant such as Si, Ti, Zr, Hf, V, Nb, Ta, Mo, W, Ru, Rh, Ir, C, Sn, Ge, Pb, Mn, As, Sb, Bi, F, Cl, Br or I. The n-type $\beta$-$Ga_2O_3$ substrate 2 has a thickness of, e.g., 100 to 600 µm. In addition, the n-type $\beta$-$Ga_2O_3$ substrate 2 includes an n-type dopant at a concentration of, e.g., from $5 \times 10^{18}$ to $1 \times 10^{20}$/cm$^3$.

Plane orientation of the main surface of the n-type $\beta$-$Ga_2O_3$ substrate 2 is not specifically limited but a plane rotated by not less than 50° and not more than 90° with respect a (100) plane is preferable. In other words, in the n-type $\beta$-$Ga_2O_3$ substrate 2, an angle $\theta$ (0<$\theta$≤90°) formed between the main surface and the (100) plane is preferably not less than 50°. Examples of the plane rotated by not less than 50° and not more than 90° with respect the (100) plane include a (010) plane, a (001) plane, a (−201) plane, a (101) plane and a (310) plane.

When the main surface of the n-type $\beta$-$Ga_2O_3$ substrate 2 is a plane rotated by not less than 50° and not more than 90° with respect to the (100) plane, it is possible to effectively suppress re-evaporation of raw materials of the $\beta$-$Ga_2O_3$-based crystal from the n-type $\beta$-$Ga_2O_3$ substrate 2 at the time of epitaxially growing the $\beta$-$Ga_2O_3$-based crystal on the n-type $\beta$-$Ga_2O_3$ substrate 2. In detail, where a percentage of the re-evaporated raw material during growth of the $\beta$-$Ga_2O_3$-based crystal at a growth temperature of 500° C. is defined as 0%, the percentage of the re-evaporated raw material can be suppressed to not more than 40% when the main surface of the n-type $\beta$-$Ga_2O_3$ substrate 2 is a plane rotated by not less than 50° and not more than 90° with respect the (100) plane. It is thus possible to use not less than 60% of the supplied raw material to form the $\beta$-$Ga_2O_3$-based crystal, which is preferable from the viewpoint of growth rate and manufacturing cost of the $\beta$-$Ga_2O_3$-based crystal.

The $\beta$-$Ga_2O_3$ crystal has a monoclinic crystal structure and typically has lattice constants of a=12.23 Å, b=3.04 Å, c=5.80 Å, $\alpha$=$\gamma$=90° and $\beta$=103.7°. In the $\beta$-$Ga_2O_3$ crystal, the (100) plane comes to coincide with the (310) plane when rotated by 52.5° around the c-axis and comes to coincide with the (010) plane when rotated by 90°. Meanwhile, the (100) plane comes to coincide with the (101) plane or the (−201) plane depending on a rotation direction when rotated by 53.8° around the b-axis and comes to coincide with the (001) plane when rotated by 76.3° in the rotation direction in which the (010) plane appears by 53.8° rotation of the (100) plane.

Alternatively, the main surface of the n-type $\beta$-$Ga_2O_3$ substrate 2 may be a plane rotated at an angle of not more than 37.5° with respect to the (010) plane. In this case, it is possible to provide a steep interface between the n-type $\beta$-$Ga_2O_3$ substrate 2 and the i-type $\beta$-$Ga_2O_3$ single crystal film 3 and it is also possible to highly accurately control the thickness of the i-type $\beta$-$Ga_2O_3$ single crystal film 3.

The n-type $\beta$-$Ga_2O_3$ single crystal film 3 is a single crystal film formed on the n-type $\beta$-$Ga_2O_3$ substrate 2 by the below-described method. The n-type $\beta$-$Ga_2O_3$ single crystal film 3 includes an n-type dopant such as Sn, Ti, Zr, Hf, V, Nb, Ta, Mo, W, Ru, Rh, Ir, C, Si, Ge, Pb, Mn, As, Sb, Bi, F, Cl, Br and I. The thickness of the n-type $\beta$-$Ga_2O_3$ single crystal film 3 is, e.g., 10 to 500 nm. In addition, the n-type $\beta$-$Ga_2O_3$ single crystal film 3 includes an n-type dopant at a concentration of, e.g., from $1 \times 10^{15}$ to $1 \times 10^{19}$/cm$^3$.

Here, another film may be formed between the n-type $\beta$-$Ga_2O_3$ substrate 2 and the n-type $\beta$-$Ga_2O_3$ single crystal film 3. This other film is, e.g., an n-type $\beta$-$Ga_2O_3$ single crystal film having an n-type dopant concentration which is higher than the n-type $\beta$-$Ga_2O_3$ single crystal film 3, and in some cases, higher than the n-type $\beta$-$Ga_2O_3$ substrate 2. In this case, the other film is formed on the n-type $\beta$-$Ga_2O_3$ substrate 2 by homoepitaxial growth and the n-type $\beta$-$Ga_2O_3$ single crystal film 3 is formed on the other film by homoepitaxial growth.

The gate electrode 21, the source electrodes 22a, 22b and the drain electrode 25 are formed of, e.g., a metal such as Au, Al, Ti, Sn, Ge, In, Ni, Co, Pt, W, Mo, Cr, Cu and Pb, an alloy containing two or more of such metals, a conductive compound such as ITO, or a conductive polymer. Polythiophene derivatives (PEDOT: poly(3,4-ethylenedioxythiophene)) doped with polystyrene sulfonate (PSS) or polypyrrole derivatives doped with TCNA are used as the conductive polymer. In addition, the gate electrode 21 may have a two-layer structure composed of two different metals, e.g., Al/Ti, Au/Ni or Au/Co.

The gate insulating film 26 is formed of an insulating material such as $SiO_2$, AlN, SiN, $Al_2O_3$ or $\beta$-$(Al_xGa_{1-x})_2O_3$ (0≤x≤1). Of those, $\beta$-$(Al_xGa_{1-x})_2O_3$ can be grown as a single crystal film on a $\beta$-$Ga_2O_3$ crystal and thus allows a good semiconductor/insulating film interface with less interface states to be formed, resulting in better gate characteristics than when using other insulating films.

The contact regions 23a and 23b are regions having a high n-type dopant concentration formed in the n-type $\beta$-$Ga_2O_3$ single crystal film 3 and are respectively connected to the source electrodes 22a and 22b. The n-type dopant included in the contact regions 23a and 23b and the main n-type dopant included in the n-type $\beta$-$Ga_2O_3$ single crystal film 3 may be either the same or different.

The body regions 24a and 24b include a p-type dopant such as Mg, H, Li, Na, K, Rb, Cs, Fr, Be, Ca, Sr, Ba, Ra, Mn, Fe, Co, Ni, Pd, Cu, Ag, Au, Zn, Cd, Hg, Tl, Pb, N or P. The body regions 24a and 24b are p-type regions or high resistance regions which behave like i-type due to charge compensation.

(Method of Manufacturing $Ga_2O_3$-Based MISFET)

The method of manufacturing the $\beta$-$Ga_2O_3$-based single crystal film is PLD (Pulsed Laser Deposition), CVD (Chemical Vapor Deposition), sputtering or MBE (Molecular Beam Epitaxy) etc. In the present embodiment, a thin film growth method using the MBE is employed. The MBE is a crystal growth method in which a single or compound solid is heated in an evaporation source called cell and vapor generated by heat is supplied as a molecular beam onto the surface of the substrate.

Figure 2:
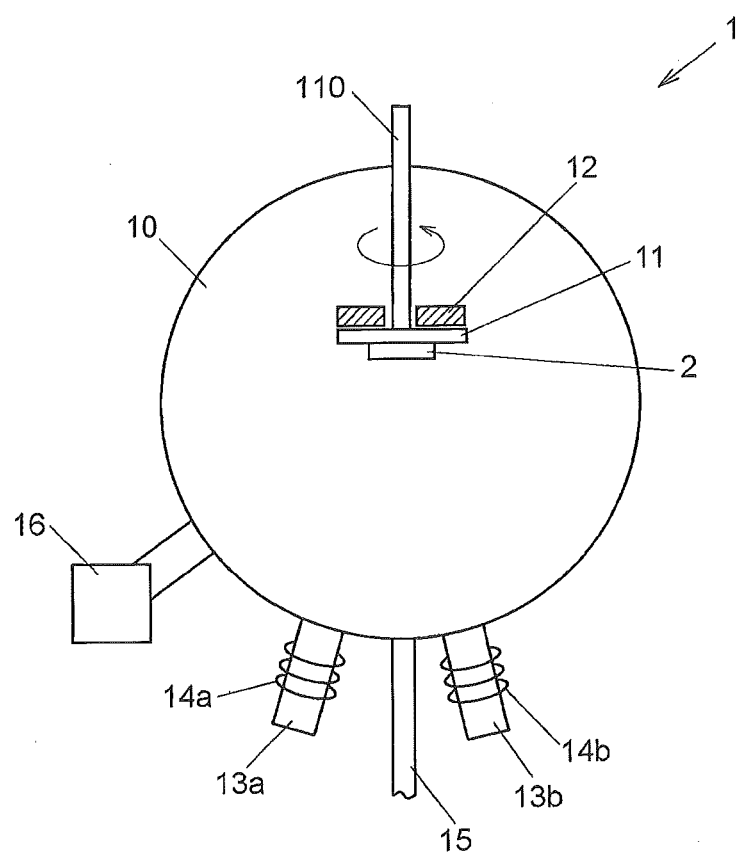
FIG. 2 is a schematic structural diagram illustrating a structure of a MBE system in the first embodiment.

FIG. 2 is a structural diagram illustrating an example of an MBE system used for forming the $\beta$-$Ga_2O_3$-based single crystal film. The MBE system 1 is provided with a vacuum chamber 10, a substrate holder 11 supported in the vacuum chamber 10 to hold the n-type $\beta$-$Ga_2O_3$ substrate 2, heating devices 12 held on the substrate holder 11 to heat the n-type $\beta$-$Ga_2O_3$ substrate 2, plural cells 13 (13a, 13b) each provided for each atom or molecule constituting a thin film, heaters 14 (14a, 14b) for hearing the plural cells 13, a gas supply pipe 15 for supplying oxygen-based gas into the vacuum chamber 10, and a vacuum pump 16 for exhausting the air in the vacuum chamber 10. It is configured that the substrate holder 11 can be rotated by a non-illustrated motor via a shaft 110.

A Ga raw material of the $\beta$-$Ga_2O_3$-based single crystal film, such as Ga powder, is loaded in the first cell 13a. The Ga powder desirably has a purity of not less than 6N. Powder of an n-type dopant raw material to be doped as a donor is loaded in the second cell 13b. A shutter is provided at an opening of each of the first cell 13a and the second cell 13b.

The preliminarily-formed n-type $\beta$-$Ga_2O_3$ substrate 2 is attached to the substrate holder 11 and a $\beta$-$Ga_2O_3$ crystal is then homoepitaxially grown on the n-type $\beta$-$Ga_2O_3$ substrate 2 while adding an n-type dopant, thereby forming the n-type $\beta$-$Ga_2O_3$ single crystal film 3.

The n-type $\beta$-$Ga_2O_3$ substrate 2 is made by, e.g., the following procedure. Firstly, an n-type $\beta$-$Ga_2O_3$ single crystal ingot doped with an n-type dopant such as Si is made by the EFG (edge-defined film-fed growth) method. It should be noted that an element to be added is not limited to Si. When substituting, e.g., Ga site, it is possible to use Ti, Zr, Hf, V, Nb, Ta, Mo, W, Ru, Rh, Ir, C, Sn, Ge, Pb, Mn, As, Sb or Bi. Meanwhile, it is possible to use F, Cl, Br or I when substituting oxygen site. For adding Si, $SiO_2$ powder is mixed to raw material powder. Not less than 0.05 mol % of $SiO_2$ is added to impart good conductivity to the n-type $\beta$-$Ga_2O_3$ substrate 2. The donor concentration in the n-type $\beta$-$Ga_2O_3$ single crystal ingot is, e.g., $5 \times 10^{18}$ to $1 \times 10^{20}/cm^3$. Alternatively, the n-type $\beta$-$Ga_2O_3$ single crystal ingot may be made by the FZ (floating zone) method. The obtained ingot is sliced to a thickness of, e.g., about 1 mm so that the main surface has a desired plane orientation, thereby forming a substrate. Then, a grinding and polishing process is performed to a thickness of about 100 to 600 μm.

Next, the n-type $\beta$-$Ga_2O_3$ substrate 2 made by the above procedure is attached to the substrate holder 11 of the MBE system 1. Next, the vacuum pump 16 is activated to reduce atmospheric pressure in the vacuum chamber 10 to about $10^{-8}$ Torr. Then, the n-type $\beta$-$Ga_2O_3$ substrate 2 is heated by the heating devices 12. Here, radiation heat of heat source such as graphite heater of the heating device 12 is thermally transferred to the n-type $\beta$-$Ga_2O_3$ substrate 2 via the substrate holder 11 and the n-type $\beta$-$Ga_2O_3$ substrate 2 is thereby heated.

After the n-type $\beta$-$Ga_2O_3$ substrate 2 is heated to a predetermined temperature, oxygen-based gas is supplied into the vacuum chamber 10 through the gas supply pipe 15.

After a period of time required for stabilization of gas pressure in the vacuum chamber 10 (e.g., after 5 minutes) since the oxygen-based gas was supplied into the vacuum chamber 10, the first cell 13a and the second cell 13b are respectively heated by the first heater 14a and the second heater 14b while rotating the substrate holder 11 so that Ga and n-type dopant are evaporated and are radiated as molecular beam onto the surface of the n-type $\beta$-$Ga_2O_3$ substrate 2.

For example, the first cell 13a is heated to 900° C. and beam-equivalent pressure (BEP) of Ga vapor is $1 \times 10^{-4}$ Pa.

As such, the $\beta$-$Ga_2O_3$ crystal is homoepitaxially grown on the main surface of the n-type $\beta$-$Ga_2O_3$ substrate 2 while being doped with the n-type dopant such as Sn and the n-type $\beta$-$Ga_2O_3$ single crystal film 3 is thereby formed. Growth temperature of the $\beta$-$Ga_2O_3$ crystal is, e.g., 700° C. It should be noted that as the n-type dopant other than Sn, it is possible to use Ti, Zr, Hf, V, Nb, Ta, Mo, W, Ru, Rh, Ir, C, Si, Ge, Pb, Mn, As, Sb and Bi, etc., for substituting Ga site and it is possible to use F, Cl, Br and I, etc., for substituting oxygen site. The addition concentration of the n-type dopant is selected from the range of, e.g., $1 \times 10^{15}$ to $1 \times 10^{19}/cm^3$.

Alternatively, the n-type $\beta$-$Ga_2O_3$ single crystal film 3 may be formed by the PLD (Pulsed Laser Deposition) or the CVD (Chemical Vapor Deposition) etc.

Figure 3A:
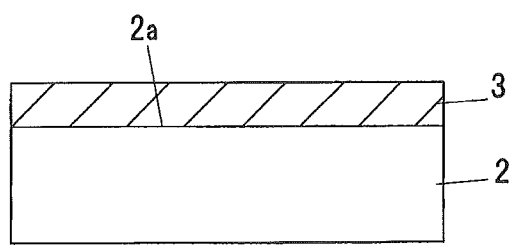
FIG. 3A is a cross sectional view showing an n-type $\beta$-$Ga_2O_3$ substrate and an n-type $\beta$-$Ga_2O_3$ single crystal film in the first embodiment.
Figure 3B:
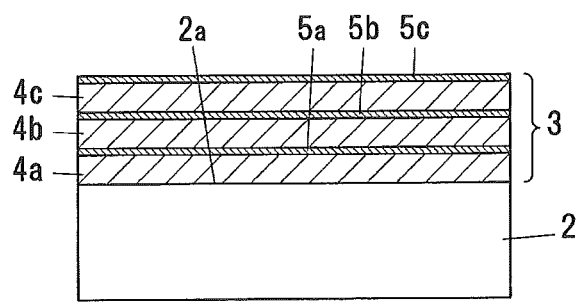
FIG. 3B is a cross sectional view showing an n-type $\beta$-$Ga_2O_3$ substrate and an n-type $\beta$-$Ga_2O_3$ single crystal film in the first embodiment.

FIGS. 3A and 3B are cross sectional views showing the n-type $\beta$-$Ga_2O_3$ single crystal film 3 in the present embodiment. The n-type $\beta$-$Ga_2O_3$ single crystal film 3 is formed on a main surface 2a of the n-type $\beta$-$Ga_2O_3$ substrate 2 by the MBE mentioned above.

FIG. 3A shows the n-type $\beta$-$Ga_2O_3$ single crystal film 3 which is formed by continuously adding the n-type dopant during homoepitaxial growth of the $\beta$-$Ga_2O_3$ crystal.

The donor concentration in the n-type $\beta$-$Ga_2O_3$ single crystal film 3 is, e.g., $1 \times 10^{15}$ to $1 \times 10^{19}/cm^3$ and is especially preferably $1 \times 10^{15}$ to $1 \times 10^{18}/cm^3$. This donor concentration can be controlled by temperature of the second cell 13b during film formation.

FIG. 3B shows the n-type $\beta$-$Ga_2O_3$ single crystal film 3 which is formed by intermittently adding the n-type dopant at certain intervals during homoepitaxial growth of the $\beta$-$Ga_2O_3$ crystal. In this case, Sn is used as the n-type dopant.

In detail, Sn vapor is intermittently generated from the second cell 13b by operating the shutter of the second cell 13b, thereby intermittently adding Sn to the $\beta$-$Ga_2O_3$ crystal. It is preferable that Sn be intermittently added twice or more. In this case, electrical conductivity according to the added amount of Sn can be imparted to the n-type $\beta$-$Ga_2O_3$ single crystal film 3 without performing annealing treatment.

Due to intermittent Sn addition during the film formation, the n-type $\beta$-$Ga_2O_3$ single crystal film 3 in FIG. 3B has first layers 4 (4a, 4b, 4c) grown during the period with no Sn addition and second layers 5 (5a, 5b, 5c) grown during the period with Sn addition.

The Sn concentration in the second layer 5 can be controlled by temperature of the second cell 13b during the film formation. The first layer 4, which ideally does not contain Sn, only contains a trace amount of Sn diffused from the second layer 5. Therefore, the Sn concentration in the first layer 4 is lower than that in the second layer 5. An average Sn concentration in the n-type $\beta$-$Ga_2O_3$ single crystal film 3 is, e.g., $1 \times 10^{14}$ to $3 \times 10^{18}/cm^3$ and is especially preferably $1 \times 10^{15}$ to $1 \times 10^{18}/cm^3$.

For example, the first layers 4a, 4b and 4c are 3 to 20 nm in thickness and the second layers 5a, 5b and 5c are 0.2 to 1 nm in thickness. If the thickness of the first layers 4a, 4b and 4c is greater than 20 nm, the effect of providing the n-type may be reduced since intervals of the second layers 5a, 5b and 5c are too large. On the other hand, if the thickness of the second layers 5a, 5b and 5c is greater than 1 nm, the effect of intermittently providing the n-type may be reduced since the amount of Sn diffused from the second layers 5a, 5b and 5c into the first layers 4a, 4b and 4c is too large.

It should be noted that the lowermost layer of the n-type β-Ga$_2$O$_3$ single crystal film 3 (the layer in contact with the main surface 2a of the n-type β-Ga$_2$O$_3$ substrate 2) may be either the first layer 4 or the second layer 5. In addition, the number of the first layers 4 and that of the second layers 5 are not limited.

After forming the n-type β-Ga$_2$O$_3$ single crystal film 3, the body regions 24a and 24b are formed by ion-implanting a p-type dopant such as Mg into the n-type β-Ga$_2$O$_3$ single crystal film 3. It should be noted that the ion to be implanted is not limited to Mg and, when substituting, e.g., Ga site, it is possible to use H, Li, Na, K, Rb, Cs, Fr, Be, Ca, Sr, Ba, Ra, Mn, Fe, Co, Ni, Pd, Cu, Ag, Au, Zn, Cd, Hg, Tl or Pb. In addition, it is possible to use N or P when substituting oxygen site. After implanting the p-type dopant, damage caused by implantation is repaired by performing annealing treatment.

It should be noted that the method of forming the body regions 24a and 24b is not limited to ion implantation and thermal diffusion process may be used. In this case, after metal such as Mg is brought into contact with the n-type β-Ga$_2$O$_3$ single crystal film 3 in a region for the body regions 24a and 24b to be formed, heat treatment is performed to diffuse a dopant such as Mg into the n-type β-Ga$_2$O$_3$ single crystal film 3.

Next, the contact regions 23a and 23b are formed by ion-planting the n-type dopant such as Sn into the body regions 24a and 24b of the n-type β-Ga$_2$O$_3$ single crystal film 3. It should be noted that the ion to be implanted is not limited to Sn and, when substituting, e.g., Ga site, it is possible to use Ti, Zr, Hf, V, Nb, Ta, Mo, W, Ru, Rh, Ir, C, Si, Ge, Pb, Mn, As, Sb or Bi. In addition, it is possible to use F, Cl, Br or I when substituting oxygen site. The implantation concentration is, e.g., not less than $1\times10^{18}$/cm$^3$ and not more than $5\times10^{19}$ cm$^3$. The implantation depth is not less than 30 nm. After implantation, the surface of the implanted region is etched about 10 nm by hydrofluoric acid. Sulfuric acid, nitric acid or hydrochloric acid may be used instead. After that, implantation damage is repaired by performing annealing treatment in a nitrogen atmosphere at not less than 800° C. for not less than 30 minutes. In case of performing the annealing treatment in an oxygen atmosphere, treatment temperature is not less than 800° C. and not more than 950° C. and treatment time is not less than 30 minutes.

It should be noted that the method of fouling the contact regions 23a and 23b is not limited to ion implantation and thermal diffusion process may be used. In this case, after metal such as Sn is brought into contact with the n-type β-Ga$_2$O$_3$ single crystal film 3 in a region for the contact regions 23a and 23b to be formed, heat treatment is performed to diffuse a dopant such as Sn into the n-type β-Ga$_2$O$_3$ single crystal film 3.

After that, the gate insulating film 26, the gate electrode 21, the source electrodes 22a, 22b and the drain electrode 25 are formed.

Second Embodiment

A Ga$_2$O$_3$-based MISFET having a trench gate structure will be described as the Ga$_2$O$_3$-based semiconductor element in the second embodiment.
(Structure of Ga$_2$O$_3$-Based MISFET)

Figure 4:
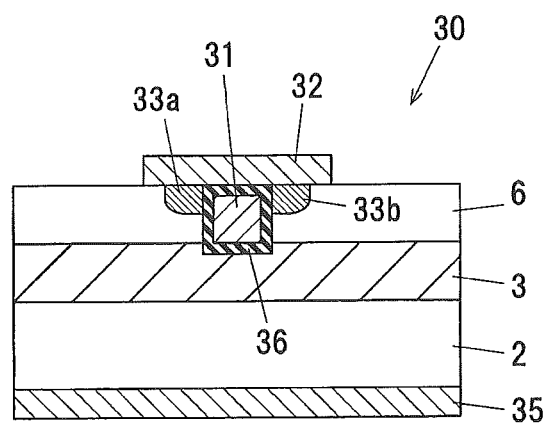
FIG. 4 is a cross sectional view showing a $Ga_2O_3$-based MISFET in a second embodiment.

FIG. 4 is a cross sectional view showing a Ga$_2$O$_3$-based MISFET 30 in the second embodiment. The Ga$_2$O$_3$-based MISFET 30 includes the n-type β-Ga$_2$O$_3$ single crystal film 3 formed on the n-type β-Ga$_2$O$_3$ substrate 2, an undoped β-Ga$_2$O$_3$ single crystal film 6 formed on the n-type β-Ga$_2$O$_3$ single crystal film 3, a gate electrode 31 which is covered with a gate insulating film 36 and is embedded in the undoped β-Ga$_2$O$_3$ single crystal film 6, contact regions 33a and 33b formed in the undoped β-Ga$_2$O$_3$ single crystal film 6 respectively on both sides of the gate electrode 31, a source electrode 32 which is formed on the undoped β-Ga$_2$O$_3$ single crystal film 6 and is connected to the contact regions 33a and 33b, and a drain electrode 35 formed on the n-type β-Ga$_2$O$_3$ substrate 2 on a surface opposite to the n-type β-Ga$_2$O$_3$ single crystal film 3.

The Ga$_2$O$_3$-based MISFET 30 is a vertical-type semiconductor element in which source and drain electrodes are arranged respectively on upper and lower sides of the element and current flows in a vertical direction. When voltage of more than the threshold is applied to the gate electrode 31, channels are formed in the undoped β-Ga$_2$O$_3$ single crystal film 6 on both sides of the gate electrode 31 and a current thus flows from the source electrode 32 to the drain electrode 35.

The gate electrode 31, the gate insulating film 36, the source electrode 32 and the drain electrode 35 are respectively formed of the same materials as the gate electrode 21, the gate insulating film 26, the source electrodes 22 (22a, 22b) and the drain electrode 25 in the first embodiment.

The undoped β-Ga$_2$O$_3$ single crystal film 6 is a high-resistance β-Ga$_2$O$_3$ single crystal film which does not include a dopant. Although there may be a case where conductivity thereof is low due to crystal defects, etc., electric resistance thereof is sufficiently high and a current never flows from the source electrode 32 to the drain electrode 35 unless voltage is applied to the gate electrode 31. The undoped β-Ga$_2$O$_3$ single crystal film 6 has a thickness of, e.g., 0.1 to 100 μm.

The contact regions 33 (33a, 33b) include the same n-type dopant as the contact regions 23 (23a and 23b) of the first embodiment.
(Method of Manufacturing Ga$_2$O$_3$-Based MISFET)

Firstly, the n-type β-Ga$_2$O$_3$ substrate 2 and the n-type β-Ga$_2$O$_3$ single crystal film 3 are formed through the same processes as the first embodiment.

Next, a β-Ga$_2$O$_3$ single crystal is grown on the n-type β-Ga$_2$O$_3$ single crystal film 3 by the MBE without adding a dopant, thereby forming the undoped β-Ga$_2$O$_3$ single crystal film 6. The specific method of forming the undoped β-Ga$_2$O$_3$ single crystal film 6 is, e.g., based on the method of forming the n-type β-Ga$_2$O$_3$ single crystal film 3 where the process of implanting the n-type dopant is eliminated.

Next, a contact region is formed by ion-planting the n-type dopant such as Sn into the undoped β-Ga$_2$O$_3$ single crystal film 6. It should be noted that the ion to be implanted is not limited to Sn and, when substituting, e.g., Ga site, it is possible to use Ti, Zr, Hf, V, Nb, Ta, Mo, W, Ru, Rh, Ir, C, Si, Ge, Pb, Mn, As, Sb or Bi. In addition, it is possible to use F, Cl, Br or I when substituting oxygen site. The implantation concentration is, e.g., not less than $1\times10^{18}$/cm$^3$ and not more than $5\times10^{19}$ cm$^3$. The implantation depth is not less than 30 nm. After implantation, the surface of the implanted region is etched about 10 nm by hydrofluoric acid. Sulfuric acid, nitric acid or hydrochloric acid may be used instead. After that, implantation damage is repaired by performing annealing treatment in a nitrogen atmosphere at not less than 800° C. for not less than 30 minutes. In case of performing the annealing treatment in an oxygen atmosphere, treatment temperature is not less than 800° C. and not more than 950° C. and treatment time is not less than 30 minutes.

It should be noted that the method of forming the contact region is not limited to ion implantation and thermal diffusion process may be used. In this case, after metal such as Sn is brought into contact with the undoped β-$Ga_2O_3$ single crystal film 6 in a region for the contact region to be formed, heat treatment is performed to diffuse a dopant such as Sn into the undoped β-$Ga_2O_3$ single crystal film 6.

Next, the surface of the undoped β-$Ga_2O_3$ single crystal film 6 in the region having the contact region is dry-etched to form a trench and the gate electrode 31 covered with the gate insulating film 36 is embedded in the trench. Here, the contact region is divided into the contact regions 33a and 33b by forming the trench.

In detail, for example, the gate insulating film 36 is formed on bottom and side surfaces of the trench by deposition method and etching, the gate electrode 31 is then formed thereon by deposition method and etching and the gate insulating film 36 is lastly formed on the gate electrode 31 by deposition method and etching.

After that, the source electrode 32 and the drain electrode 35 are formed.

Third Embodiment

The third embodiment is different from the second embodiment in that a p-type β-$Ga_2O_3$ single crystal film is formed instead of the undoped β-$Ga_2O_3$ single crystal film 6. The explanations for the same features as the second embodiment will be omitted or simplified.
(Structure of $Ga_2O_3$-Based MISFET)

Figure 5:
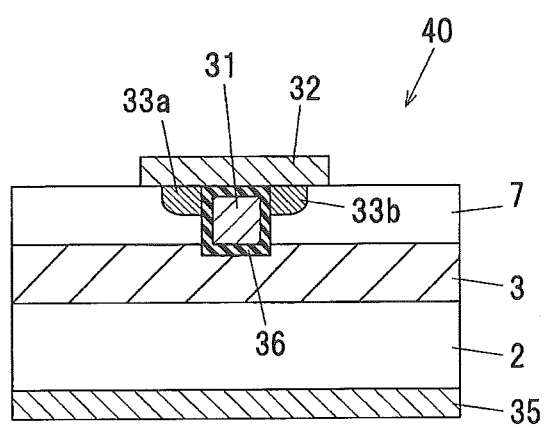
FIG. 5 is a cross sectional view showing a $Ga_2O_3$-based MISFET in a third embodiment.

FIG. 5 is a cross sectional view showing a $Ga_2O_3$-based MISFET 40 in the third embodiment. The $Ga_2O_3$-based MISFET 40 includes the n-type β-$Ga_2O_3$ single crystal film 3 formed on the n-type β-$Ga_2O_3$ substrate 2, a p-type β-$Ga_2O_3$ single crystal film 7 formed on the n-type β-$Ga_2O_3$ single crystal film 3, the gate electrode 31 which is covered with a gate insulating film 36 and is embedded in the p-type β-$Ga_2O_3$ single crystal film 7, the contact regions 33a and 33b formed in the p-type β-$Ga_2O_3$ single crystal film 7 respectively on both sides of the gate electrode 31, the source electrode 32 which is formed on the p-type β-$Ga_2O_3$ single crystal film 7 and is connected to the contact regions 33a and 33b, and the drain electrode 35 formed on the n-type β-$Ga_2O_3$ substrate 2 on a surface opposite to the n-type β-$Ga_2O_3$ single crystal film 3.

The $Ga_2O_3$-based MISFET 40 is a vertical-type semiconductor element in which source and drain electrodes are arranged respectively on upper and lower sides of the element and current flows in a vertical direction. When voltage of more than the threshold is applied to the gate electrode 31, channels are formed in the p-type β-$Ga_2O_3$ single crystal film 7 on both sides of the gate electrode 31 and a current thus flows from the source electrode 32 to the drain electrode 35.

The p-type β-$Ga_2O_3$ single crystal film 7 includes a p-type dopant such as Mg, H, Li, Na, K, Rb, Cs, Fr, Be, Ca, Sr, Ba, Ra, Mn, Fe, Co, Ni, Pd, Cu, Ag, Au, Zn, Cd, Hg, Tl, Pb, N or P. The p-type β-$Ga_2O_3$ single crystal film 7 has a thickness of, e.g., 0.1 to 100 μm. In addition, the p-type β-$Ga_2O_3$ single crystal film 7 includes a p-type dopant at a concentration of, e.g., from $1×10^{15}$ to $1×10^{19}/cm^3$.

Since the p-type β-$Ga_2O_3$ single crystal film 7 which is a p-type layer is used as a channel layer, the $Ga_2O_3$-based MISFET 40 has a higher threshold voltage than the $Ga_2O_3$-based MISFET 30.

The p-type β-$Ga_2O_3$ single crystal film 7 is formed by growing a β-$Ga_2O_3$ single crystal on the n-type β-$Ga_2O_3$ single crystal film 3 while adding a p-type dopant such as Mg. It should be noted that the ion to be added is not limited to Mg and, when substituting, e.g., Ga site, it is possible to use H, Li, Na, K, Rb, Cs, Fr, Be, Ca, Sr, Ba, Ra, Mn, Fe, Co, Ni, Pd, Cu, Ag, Au, Zn, Cd, Hg, Tl or Pb. In addition, it is possible to use N or P when substituting oxygen site.

Effects of the Embodiments

According to the present embodiments, it is possible to form high-quality β-$Ga_2O_3$ single crystal films by homoepitaxial growth and use of such β-$Ga_2O_3$ single crystal films allows high-quality $Ga_2O_3$-based semiconductor elements to be formed. In addition, these $Ga_2O_3$-based semiconductor elements have excellent performance since a high-quality β-$Ga_2O_3$ single crystal film is used as a channel layer.

It should be noted that the invention is not intended to be limited to the above-mentioned embodiments, and the various kinds of modifications can be implemented without departing from the gist of the invention. For example, the $Ga_2O_3$-based semiconductor element has been described as the n-type semiconductor element in the embodiments but may be a p-type semiconductor element. In this case, the conductivity type (n-type or p-type) of each member is all inverted.

In addition, constituent elements of the above-mentioned embodiments can be arbitrarily combined without departing from the gist of the invention.

Although the embodiments of the invention have been described above, the invention according to claims is not to be limited to the above-mentioned embodiments. Further, it should be noted that all combinations of the features described in the embodiments are not necessary to solve the problem of the invention.

INDUSTRIAL APPLICABILITY

A high-quality $Ga_2O_3$-based semiconductor element is provided.

REFERENCE SIGNS LIST

1: MBE system
2: n-type β-$Ga_2O_3$ substrate
3: n-type β-$Ga_2O_3$ single crystal film
6: undoped β-$Ga_2O_3$ single crystal film
7: p-type β-$Ga_2O_3$ single crystal film
20, 30, 40: $Ga_2O_3$-based MISFET
21, 31: gate electrode
22a, 22b, 32: source electrode
25, 35: drain electrode
26, 36: gate insulating film
23a, 23b, 33a, 33b: contact region
24a, 24b: body region

The invention claimed is:
1. A $Ga_2O_3$-based semiconductor element, comprising:
a β-$Ga_2O_3$ substrate comprising a first conductivity type, wherein the β-$Ga_2O_3$ substrate comprises a main surface which is rotated from 50° to 90° with respect to a (100) plane;

a β-Ga$_2$O$_3$ single crystal film formed on the main surface of the β-Ga$_2$O$_3$ substrate;
a source electrode formed on the β-Ga$_2$O$_3$ single crystal film;
a drain electrode formed on a surface of the β-Ga$_2$O$_3$ substrate opposite to the β-Ga$_2$O$_3$ single crystal film;
a contact region formed in the β-Ga$_2$O$_3$ single crystal film, connected to the source electrode and comprising the first conductivity type including a controlled first dopant concentration;
a gate electrode that is formed on the β-Ga$_2$O$_3$ single crystal film or formed via a gate insulating film in a trench formed in the β-Ga$_2$O$_3$ single crystal film; and
a high resistance region formed to surround the contact region,
wherein the β-Ga$_2$O$_3$ substrate becomes a current path between the source electrode and the drain electrode in accordance with formation of a channel in the high resistance region.

2. The Ga$_2$O$_3$-based semiconductor element according to claim 1, wherein the source electrode comprises first and second source electrodes,
wherein the gate electrode is formed via the gate insulating film on a region between the first source electrode and the second source electrode on the β-Ga$_2$O$_3$ single crystal film,
wherein the β-Ga$_2$O$_3$ single crystal film comprises the first conductivity type,
wherein the contact region comprises first and second contact regions connected to the first and second source electrodes, respectively, and
wherein the high resistance region further comprises first and second body regions having a conductivity type different from the first conductivity type and formed so as to surround the first and second contact regions, respectively.

3. The Ga$_2$O$_3$-based semiconductor element according to claim 1, wherein the β-Ga$_2$O$_3$ single crystal film is formed on the β-Ga$_2$O$_3$ substrate via an other β-Ga$_2$O$_3$ single crystal film comprising the first conductivity type,
wherein the β-Ga$_2$O$_3$ single crystal film includes no dopants,
wherein the gate electrode is formed in the trench via the gate insulating film, and
wherein the contact region comprises first and second contact regions on both sides of the gate electrode.

4. The Ga$_2$O$_3$-based semiconductor element according to claim 1, wherein the first conductivity type is n-type.

5. The Ga$_2$O$_3$-based semiconductor element according to claim 1, wherein an upper surface of the contact region is flush with an upper surface of the β-Ga$_2$O$_3$ single crystal film.

6. The Ga$_2$O$_3$-based semiconductor element according to claim 5, wherein the source electrode is disposed on the upper surface of the contact region.

7. The Ga$_2$O$_3$-based semiconductor element according to claim 5, wherein the source electrode abuts on the upper surface of the contact region.

8. The Ga$_2$O$_3$-based semiconductor element according to claim 7, wherein an upper surface of the high resistance region is flush with the upper surface of the β-Ga$_2$O$_3$ single crystal film.

9. The Ga$_2$O$_3$-based semiconductor element according to claim 8, wherein the gate insulating film is disposed on the upper surface of the high resistance region.

10. The Ga$_2$O$_3$-based semiconductor element according to claim 8, wherein the gate insulating film abuts the upper surface of the high resistance region.

11. The Ga$_2$O$_3$-based semiconductor element according to claim 10, wherein the gate insulating film is disposed on the upper surface of the contact region.

12. The Ga$_2$O$_3$-based semiconductor element according to claim 10, wherein the gate insulating film abuts the upper surface of the contact region.

13. The Ga$_2$O$_3$-based semiconductor element according to claim 12, wherein the gate electrode abuts the gate insulating film.

14. The Ga$_2$O$_3$-based semiconductor element according to claim 1, wherein the gate electrode is located above an upper surface of the contact region.

* * * * *